(12) United States Patent
Herr et al.

(10) Patent No.: US 8,489,163 B2
(45) Date of Patent: Jul. 16, 2013

(54) SUPERCONDUCTING LATCH SYSTEM

(75) Inventors: Quentin P. Herr, Ellicott City, MD (US); Anna Y. Herr, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 46 days.

(21) Appl. No.: 13/208,480

(22) Filed: Aug. 12, 2011

(65) Prior Publication Data
US 2013/0040818 A1 Feb. 14, 2013

(51) Int. Cl.
*H01L 23/48* (2006.01)
(52) U.S. Cl.
USPC .................................................. 505/190
(58) Field of Classification Search
USPC ................................ 505/162, 170, 190; 326/1
See application file for complete search history.

(56) References Cited

U.S. PATENT DOCUMENTS

| 7,724,020 | B2 | 5/2010 | Herr |
| 7,944,253 | B1 | 5/2011 | Kirichenko |
| 2010/0164536 | A1 | 7/2010 | Herr |
| 2011/0133770 | A1 | 6/2011 | Przybysz et al. |

OTHER PUBLICATIONS

International Search Report for corresponding PCT/US2012/050597, completed Oct. 4, 2012 by Blaine R. Copenheaver.
Brock, et al.: "*Superconductor ICs: The 100-GHz Second Generation*", IEEE Spectrum, Dec. 2000, [retrieved on Oct. 3, 2012]. Retrieved from the internet: <URL: http://www.hypres.com/wp-content/uploads/2011/06/BrockSPectrum00.pdf> entire document.

*Primary Examiner* — Colleen Dunn
(74) *Attorney, Agent, or Firm* — Tarolli, Sundheim, Covell & Tummino LLP

(57) ABSTRACT

A reciprocal quantum logic (RQL) latch system is provided. The latch system comprises an output portion that retains a state of the latch system, and a bi-stable loop that comprises a set input, a reset input and an output coupled to the output portion. A positive single flux quantum (SFQ) pulse on the set input when the latch system is in a reset state results in providing a SFQ current in the output portion representative of the latch system being in a set state.

20 Claims, 7 Drawing Sheets

US 8,489,163 B2

SUPERCONDUCTING LATCH SYSTEM

TECHNICAL FIELD

The present invention relates generally to superconducting circuits, and more particularly to a superconducting latch system.

BACKGROUND

In the field of digital logic, extensive use is made of well known and highly developed CMOS (complimentary metal-oxide semiconductor) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions, with typical signal power of around 4 nW (nanowatts), at a typical data rate of 20 Gb/s (gigabytes/second), or greater, and operating temperatures of around 4° Kelvin.

SUMMARY

In accordance with an aspect of the invention, a superconducting latch system is provided. The latch system comprises an output portion that retains a state of the latch system, and a bi-stable loop that comprises a set input, a reset input and an output coupled to the output portion. A positive single flux quantum (SFQ) pulse on the set input when the latch system is in a reset state results in providing a SFQ current in the output portion representative of the latch system being in a set state.

In accordance with another aspect of the invention, a reciprocal quantum logic (RQL) latch system is provided that comprises an output portion that retains a state of the latch system and a bi-stable loop that comprises a set superconducting loop coupled between a set input and the output portion and a reset superconducting loop coupled to a reset input an inductively coupled to the set superconducting loop. The latch system further comprises a direct current (DC) bias that produces a first bi-stable current in the set superconducting loop and a second bi-stable current in the reset superconducting loop, wherein a positive SFQ pulse on the set input when the latch system is in a reset state results in providing a SFQ current that propagates through the set superconducting loop to reside in the output portion, the SFQ current in the output portion being representative of the latch system being in a set state.

In yet another aspect of the invention, a method is provided for controlling a state of a superconducting latch system. The method comprises providing a bi-stable loop that includes a set input coupled to a set portion, a reset input coupled to a reset portion, the reset portion being inductively coupled to the set portion and the set portion being coupled to an output portion. The method further comprising biasing the bi-stable loop to produce a first bi-stable current in the set portion and a second bi-stable loop in the reset portion. The method further comprises providing a positive SFQ pulse on the set input and generating a SFQ current in response to the positive SFQ pulse in the output portion representative of the latch system being in a set state.

DETAILED DESCRIPTION

Reciprocal quantum logic (RQL) is a new development in superconducting logic circuits that utilizes reciprocal data encoding in which logic operations are completed using positive pulses, while the internal state is erased using corresponding negative pulses that come half a clock cycle later, to produce combinational logic behavior. Examples of RQL logic operations are disclosed in U.S. Pat. Nos. 7,724,020 and 7,977,964 both entitled "Single Flux Quantum Circuits", the entire contents of both being incorporated by reference herein.

The present invention provides for a superconducting latch implementation for RQL, such that the internal state can be saved from one clock cycle to the next. The latch employs pulse generators on the set/reset inputs. The set input only passes the first positive pulse, setting the internal state with subsequent positive and negative pulses being rejected. The reset input only passes the first positive pulse to reset a set internal state. In one aspect of the invention, a third gate input is used to readout the internal state non-destructively. In this implementation, power is only dissipated during set, reset, and read operations, and there is no power dissipation in the hold state.

Figure 1:
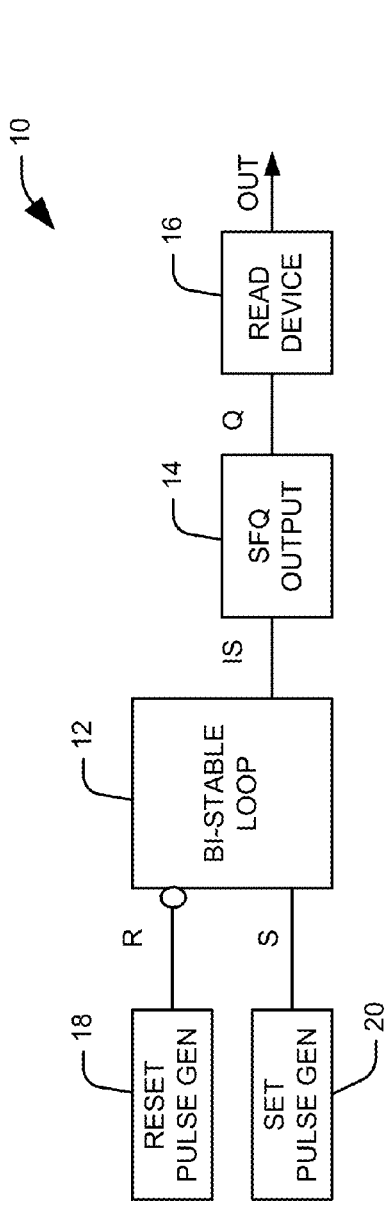
FIG. 1 illustrates a functional block diagram of a superconducting reciprocal quantum logic (RQL) latch system in accordance with an aspect of the present invention.

FIG. 1 illustrates a functional block diagram of a superconducting RQL latch system 10 in accordance with an aspect of the present invention. The latch system 10 includes a bi-stable loop 12 that provides a first bi-stable current φ/2 in a set portion of the bi-stable loop 12 and a second bi-stable current −φ/2 in a reset portion of the bi-stable loop 12. Both the first and second bi-stable currents can be produced by a DC flux bias generated from a flux bias winding (e.g., inductor) coupled to both a set coupled winding in the set portion of the bi-stable loop and a reset coupled winding in the reset portion of the bi-stable loop 12. It is to be appreciated that the bias winding could include a first bias winding coupled to the set coupled winding and a second bias winding coupled to the reset winding. It is to be appreciated that a variety of other circuit configurations could be employed to bias the bi-stable loop to produce the first and second bi-stable loops. The set coupled winding and the reset coupled winding can be inductively coupled to one another in an opposite polarity configuration such that first bi-stable current and the second bi-stable current are substantially equal and flow in opposite directions of one another. It is further to be appreciated that a winding can simply be inductance in a transmission line or some other superconducting structure and not necessarily an actual wound superconductor wire.

Figure 2:
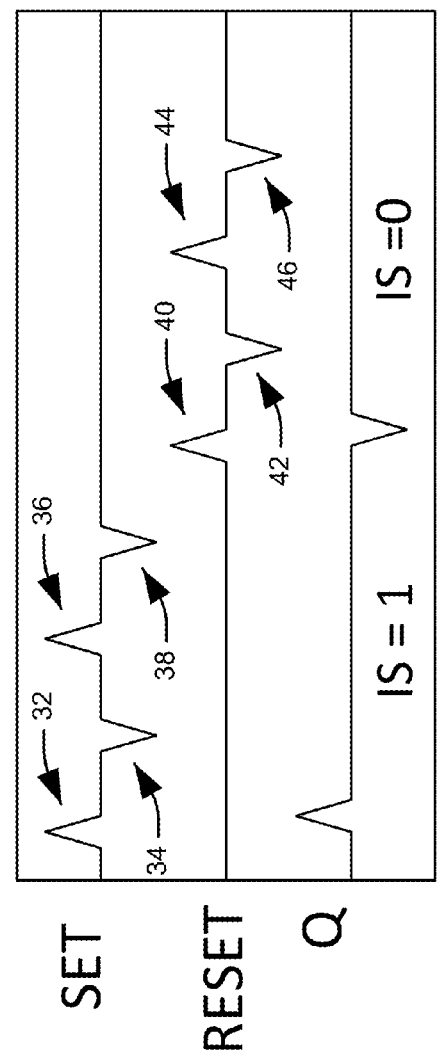
FIG. 2 illustrates an example graph of input and output of the latch system versus time in accordance with an aspect of the present invention.

The latch system 12 can be set to a set state by providing a positive single flux quantum (SFQ) pulse followed by a negative SFQ pulse on a set input of the bi-stable loop 12. For example, a set pulse generator 20 provides a positive SFQ pulse 32, as illustrated in graph 30 of FIG. 2, to the set input which results in the generation of a SFQ current φ. It is to be appreciated that φ≈2 mV*ps and φ≈2 mA*pH as is known to those skilled in the art. The SFQ current φ propagates through the set portion of the bi-stable loop 12 to an SFQ output portion 14 to set an internal state (IS=1) of the latch system 12 to a set state, such that the output Q of the SFQ output portion 14 is in a set state. The SFQ current φ is retained in the SFQ output portion 14 and can be non-destructively read at the output (Q) of the SFQ output portion 14 by a read device 16 to provide the set state output (OUT). The set pulse generator 20 then provides a negative SFQ pulse 34 that causes the polarity reversal of the set portion of the bi-stable loop 12, but does not have an effect on the set state of the SFQ output portion 14. A subsequent positive SFQ pulse 36 and subsequent negative SFQ pulse 38 on the set input also does not have an effect on the set state of the latch system 10.

Once in the set state, the latch system 10 can be set to the reset state by providing a positive SFQ pulse followed by a negative SFQ pulse on a reset input of the bi-stable loop 12. That is a reset pulse generator 18 provides a positive SFQ pulse 40, as illustrated in graph 30 of FIG. 2, to a reset input which generates a SFQ current φ through the reset portion of the bi-stable loop 12. The coupling of the set portion and reset portion of the bi-stable loop 12 generates a negative SFQ current φ through the set portion of the bi-stable loop 12 cancelling the SFQ current φ that was retained in the SFQ output portion 14. This causes the SFQ output portion to be reset to an internal state (IS=0), such that the output Q of the SFQ output portion 14 is in a reset state. The SFQ current φ is removed in the SFQ output portion 14 and the state of the latch system 10 can be non-destructively read at the output (Q) of the SFQ output portion 14 by the read device 16 to provide the reset state output (OUT). The reset pulse generator 18 then provides a negative SFQ pulse 42 which causes the polarity reversal of both the reset portion and set portion of the bi-stable loop 12 without affecting the reset state of the SFQ output portion 14. A subsequent positive SFQ pulse 44 and subsequent negative SFQ pulse 46 on the reset input does not have an effect on the reset state of the latch system 10.

Figure 3:
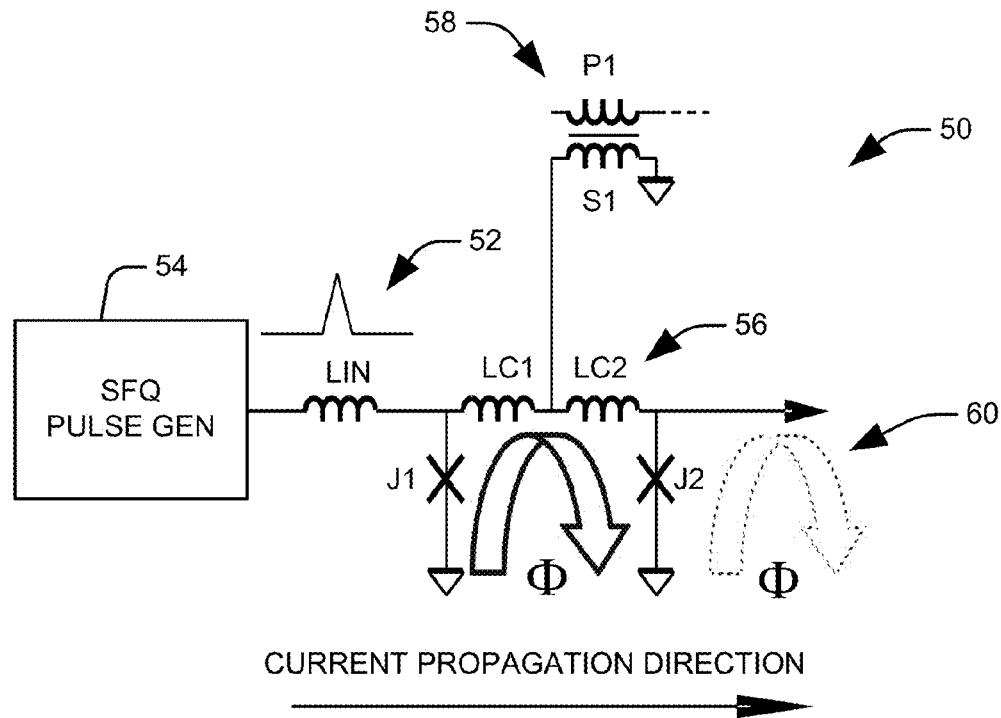
FIG. 3 illustrates a pulse generator during generation and propagation of a positive SFQ pulse provided by a SFQ pulse generator in accordance with an aspect of the present invention.
Figure 4:
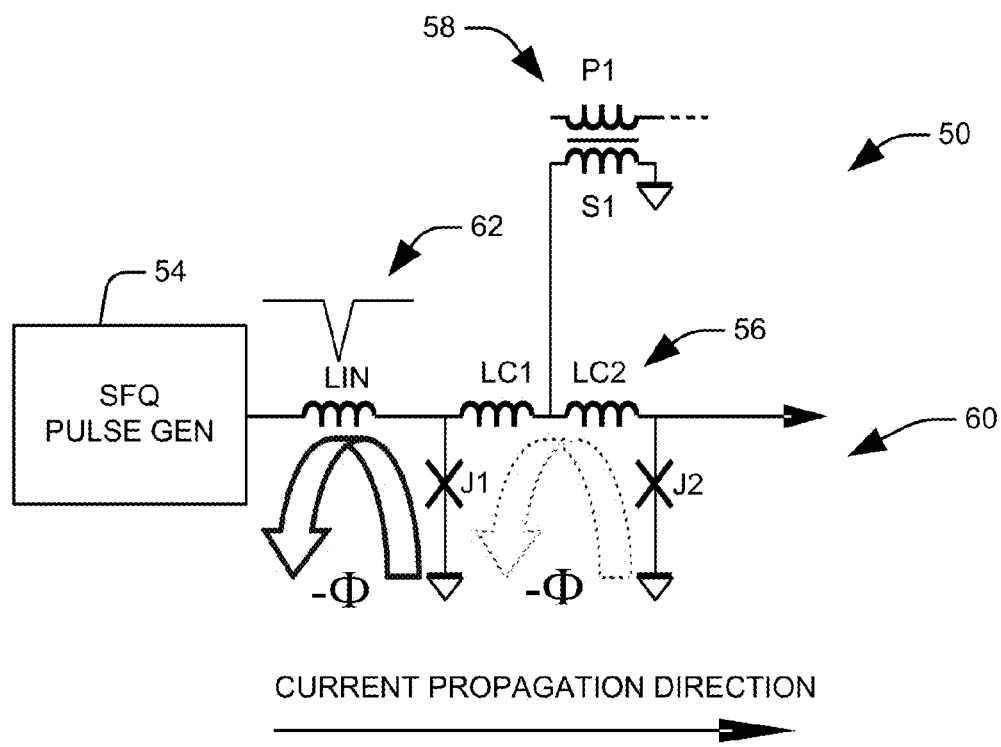
FIG. 4 illustrates the pulse generator of FIG. 3 during generation and propagation of a negative SFQ pulse provided by the SFQ pulse generator in accordance with an aspect of the present invention.
Figure 5:
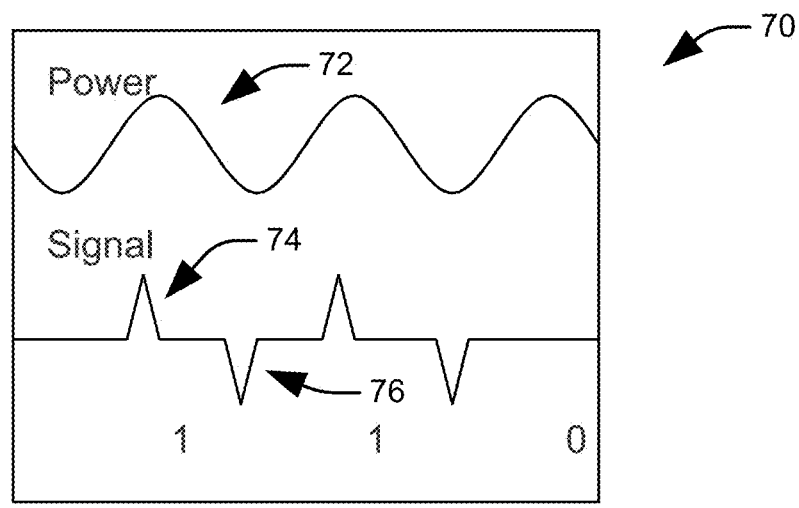
FIG. 5 illustrates an example graph of AC bias and signal inputs versus time in accordance with an aspect of the present invention.

FIGS. 3-4 illustrate operational diagrams of an example pulse generator 50 that can be employed as a set or reset pulse generator in accordance with an aspect of the present invention. FIG. 3 illustrates the pulse generator 50 during generation and propagation of a positive SFQ pulse 52 provided by a SFQ pulse generator 54. The example pulse generator 52 includes an input inductor LIN coupled to a superconducting loop 56 that includes a first and second Josephson junctions J1 and J2 and first and second coupled inductors LC1 and LC2. The pulse generator 50 also includes a superconducting biasing transformer 58 having primary and secondary windings P1 and S1. An AC bias current, as depicted by waveform 72 of graph 70 of FIG. 5, is applied across terminals of primary winding P1 of transformer 58. A bias current from secondary winding S1 is supplied to the first and second Josephson junctions J1 and J2 through first and second coupled inductors LC1 and LC1, respectively. The bias current is less than the critical current of the Josephson junctions J1 and J2 and is positive during a positive phase of the waveform 72 and negative during a negative phase of the waveform 72, such that the AC waveform is configured to provide a clocking function.

As illustrated in FIG. 3 and the graph 70 of FIG. 5, during a positive phase of the waveform 72, a positive SFQ pulse 74 can be provided to the first superconducting loop 56, which causes the first Josephson junction J1 to exceed its critical current and flip to generate a positive SFQ current φ to the second Josephson junction J2. This causes the second Josephson junction J2 to exceed its critical current and flip and generate a positive SFQ current φ (as illustrated in dashed lines) to an output portion 60 of the pulse generator 50, for example, to a set or reset input of a bi-stable loop. As illustrated in FIG. 4 and the graph of FIG. 5, during a negative phase of the waveform 72, a negative SFQ pulse 76 can be provided to the first superconducting loop 56. The negative SFQ pulse causes a negative flipping of the first Josephson junction J1, which result in the generation of a negative SFQ current −φ that is provided by the first Josephson junction J1. This causes a negative flipping of the second Josephson junction J2 which result in the generation of a negative SFQ current −φ that is provided by the second Josephson junction J2 (as illustrated in dashed lines). The negative flipping effectively cancels the currents generated by the first and second Josephson junctions J1 and J2 during the positive phase the waveform 70 and resets the first and second Josephson junctions J1 and J2 and the current in the bias inductor.

Figure 6:
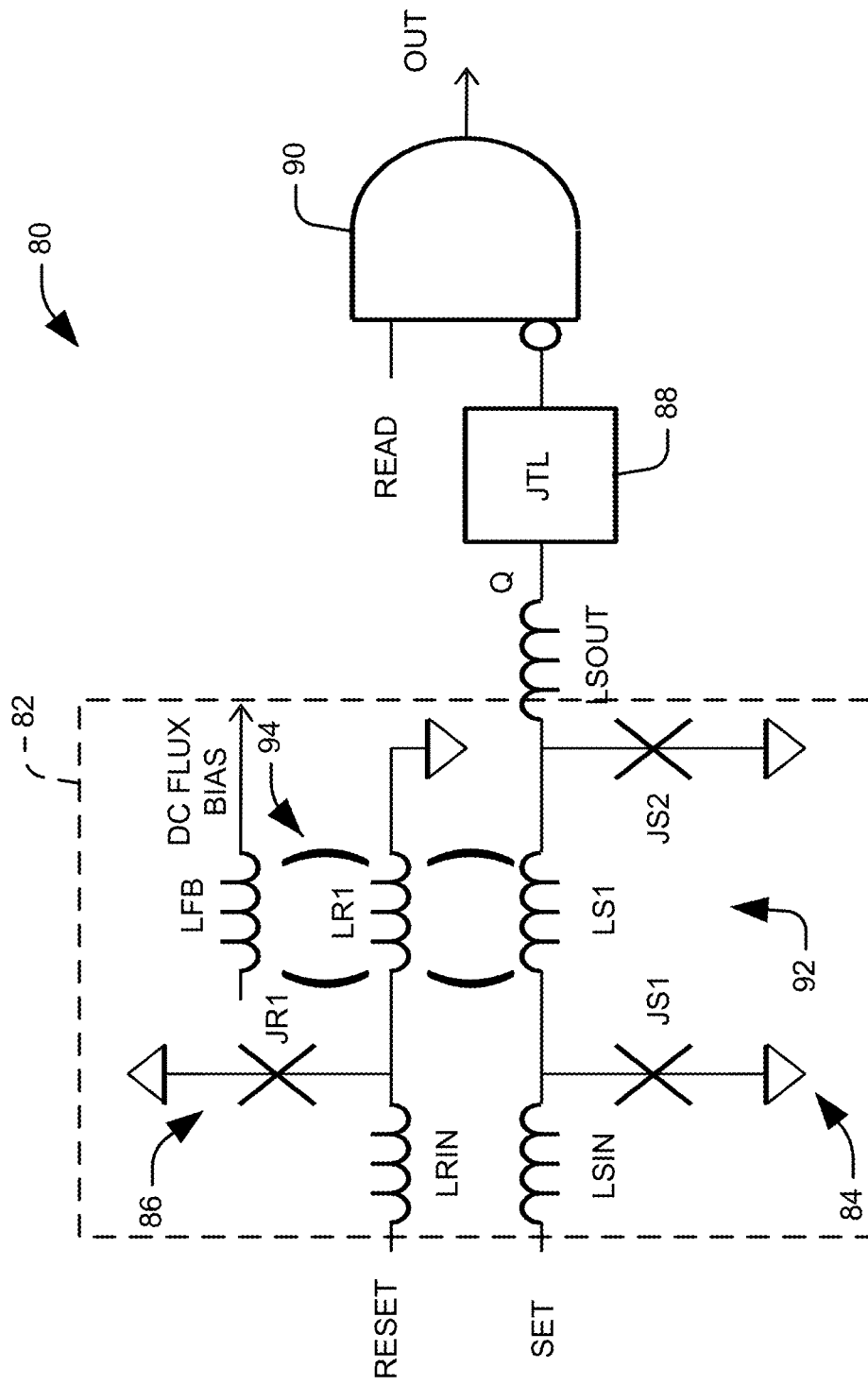
FIG. 6 illustrates a schematic diagram of a portion of an RQL latch system in accordance with an aspect of the present invention.

FIG. 6 illustrates a schematic diagram of a portion of an RQL latch system 80 in accordance with an aspect of the present invention. The latch system 80 includes a bi-stable loop 82 that includes a set portion 84 and a reset portion 86. The set portion 84 includes a set input coupled to a first end of a first set Josephson junction JS1 through and input inductor LSIN. A second end of the first set Josephson junction JS1 is connected to ground. The first end of the first set Josephson junction JS1 is coupled to a first end of a second Josephson junction JS2 through a set coupled inductor LS1. A second end of the second set Josephson junction JS2 is coupled to a JTL device 88 through an output inductor LSOUT. The state of the latch system 80 resides in an output portion of the system. The output portion is a last superconducting loop of the set output inductor LSOUT and JTL device 88. The JTL device 88 can be formed of one or more Josephson junction and inductor superconducting loops. A readout circuit 90 can be enabled to non-destructively read the output of the output portion of the latch system 80. The reset portion includes a reset input coupled to a first end of a first reset Josephson junction JR1 through a reset input inductor LRIN. A second end of the first reset Josephson junction JR1 is connected to ground. The first end of the first reset Josephson junction JR1 is coupled to ground through a reset coupled inductor LR1. It is to be appreciated that reset coupled inductor LR1 can be coupled to a JTL device instead of ground.

Figure 7:
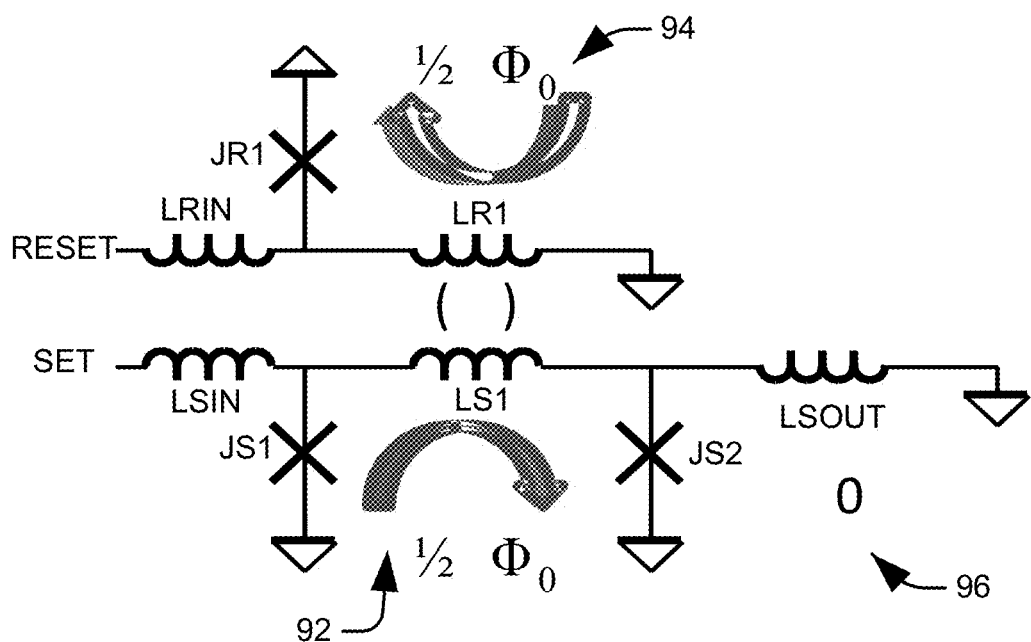
FIG. 7 illustrates a schematic operational diagram of the RQL latch system of FIG. 6 in a reset state in accordance with an aspect of the present invention.

A set superconducting loop 92 is formed from the first set Josephson junction JS1, the set coupled inductor LS1 and the second set Josephson junction JS2. A reset superconducting loop 94 is formed from the first reset Josephson junction JR1 and the reset coupled inductor LR1. Both the set coupled inductor LS1 and the reset coupled inductor LR1 are inductively coupled to a flux bias inductor LFB that provides a DC flux bias to both the set superconducting loop 92 and the reset superconducting loop 94. The DC flux bias induces a first bi-stable current $\phi/2$ in the set superconducting loop 92 and a second bi-stable current $-\phi/2$ in the reset superconducting loop 94, as illustrated in FIG. 7.

Figure 8:
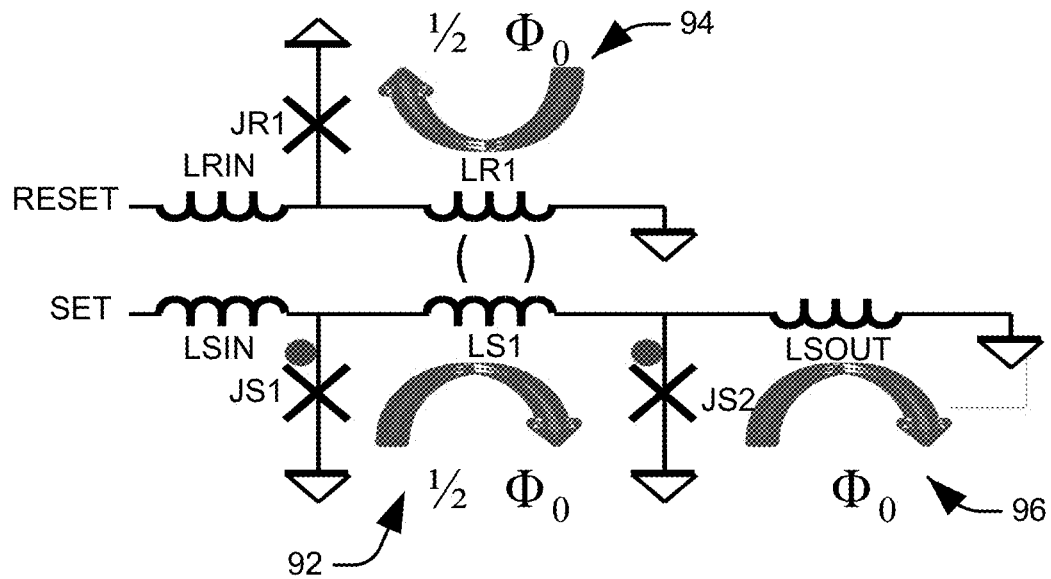
FIG. 8 illustrates a schematic operational diagram of the RQL latch system of FIG. 7 after a positive SFQ pulse at the set input in accordance with an aspect of the present invention.
Figure 9:
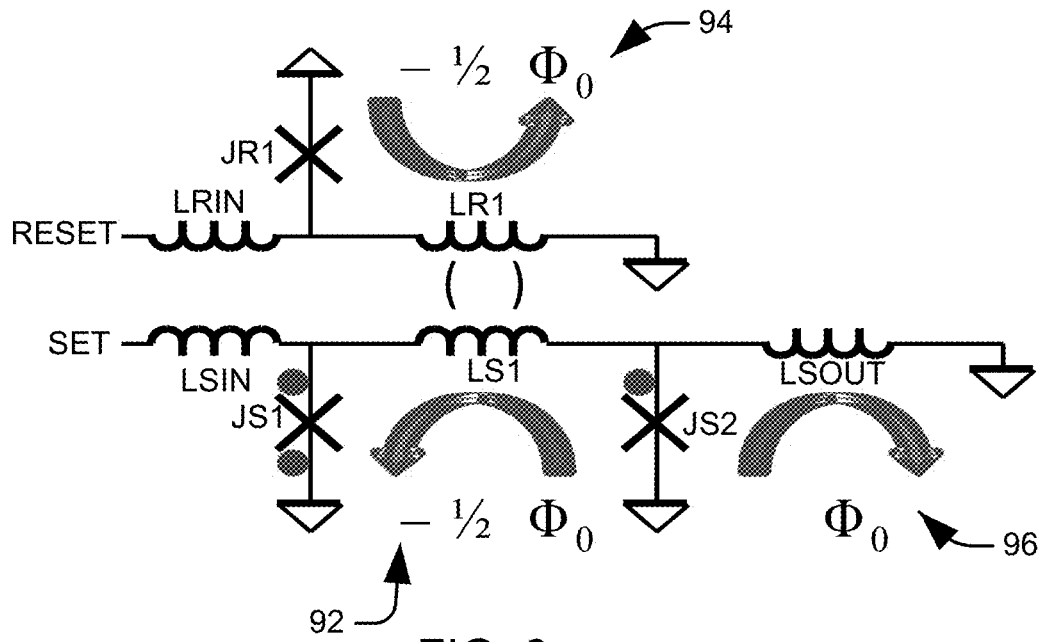
FIG. 9 illustrates a schematic operational diagram of the RQL latch system of FIG. 8 after a negative SFQ pulse at the set input in accordance with an aspect of the present invention.

As stated above, a positive SFQ pulse on the set input trips the first set Josephson junction JS2 that generates a SFQ current $\phi$ that is added to the first bi-stable current $\phi/2$ to produce a current $3*\phi/2$. This condition is unstable and causes the second set Josephson junction to flip and propagate the SFQ current $\phi$ to an SFQ output portion 96 formed from the set output inductor LSOUT and the JTL 88 to set an output Q of the SFQ output portion 96 in a set state. The flipping of Josephson junctions will continue through each of the Josephson junction and inductor superconducting loops of the set output inductor LSOUT and JTL device 88. The SFQ current $\phi$ is retained in the SFQ output portion 96 and can be non-destructively read at the output (Q) of the SFQ output portion 96 by the read device 90 to provide the set state output (OUT). FIG. 8 illustrates that the first set superconducting loop 92 returns to its first bi-stable current $\phi/2$ with a SFQ current $\phi$ residing in the SFQ output portion A subsequent negative SFQ pulse causes the polarity reversal of the SFQ current $-\phi/2$ in the set superconducting loop 92 and flipping and resetting of the first Josephson junction JS1. The polarity reversal of the SFQ current $-\phi/2$ in the set superconducting loop 92 does not have an effect on the set state of the SFQ output portion 96. However, the polarity reversal in the set superconducting loop 92 causes polarity reversal of the SFQ current in the reset superconducting loop 94. The resultant SFQ currents in the set superconducting loop 92, the reset superconducting loop 94 and the output portion 96 are illustrated in FIG. 9. A subsequent positive SFQ pulse and subsequent negative SFQ pulse on the set input does not have an effect on the set state of the latch system.

Figure 10:
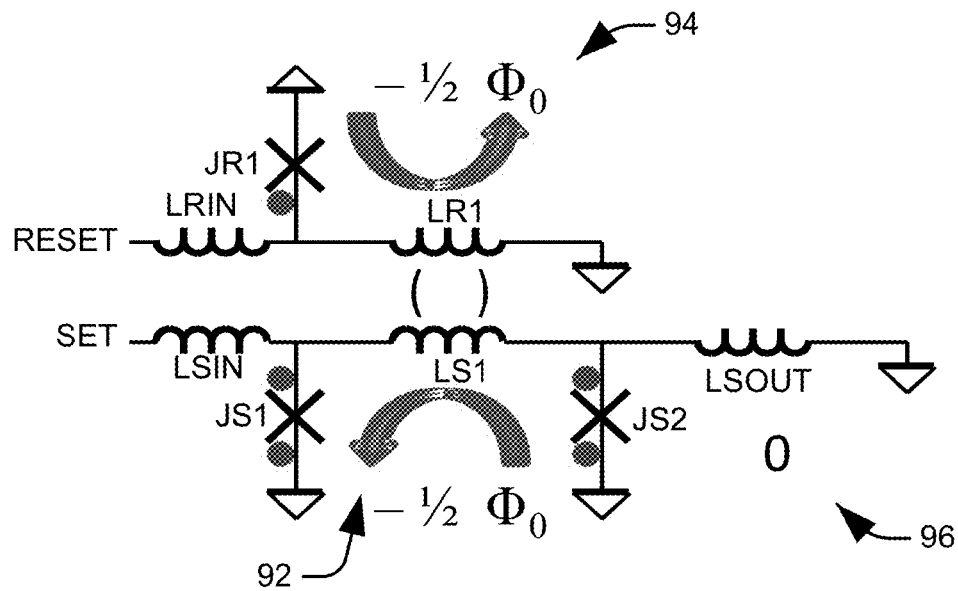
FIG. 10 illustrates a schematic operational diagram of the RQL latch system of FIG. 9 after a positive SFQ pulse at the reset input in accordance with an aspect of the present invention

As stated above, once the latch system is in a set state, a positive SFQ pulse on the reset input followed by a negative SFQ pulse on the reset input resets the latch system to a reset state. For example, a positive SFQ pulse on the reset input trips the first reset Josephson junction JR1 that generates a SFQ current $-\phi$ that is added to the second bi-stable current $-\phi/2$ to produce a current $-3*\phi/2$ in the reset superconducting loop 94. This condition causes a SFQ current $-\phi$ to be added to the first bi-stable current in the set superconducting loop. This causes the second set Josephson junction JS2 to flip and reset removing the SFQ current $\phi$ from the output portion 96. The resultant SFQ currents in the set superconducting loop 92, the reset superconducting loop 94 and the output portion 96 are illustrated in FIG. 10.

Figure 11:
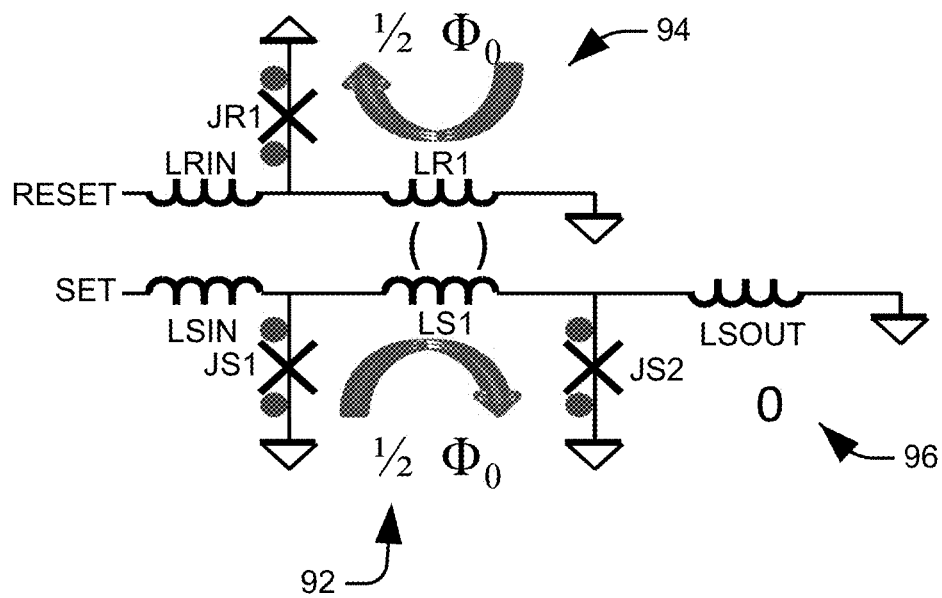
FIG. 11 illustrates a schematic operational diagram of the RQL latch system of FIG. 10 after a negative SFQ pulse at the reset input in accordance with an aspect of the present invention.

A subsequent negative SFQ pulse on the reset input causes the polarity reversal of the SFQ current from $-\phi/2$ to $\phi/2$ in the reset superconducting loop 94, which results in the polarity reversal of the SFQ current from $-\phi/2$ to $\phi/2$ in the set superconducting loop 92. The polarity reversal of the SFQ current in the set superconducting loop 94 does not have an effect on the reset state of the SFQ output portion 96. The resultant SFQ currents in the set superconducting loop 92, the reset superconducting loop 94 and the output portion 96 are illustrated in FIG. 11. A subsequent positive SFQ pulse and subsequent negative SFQ pulse on the reset input does not have an effect on the reset state of the latch system.

Figure 12:
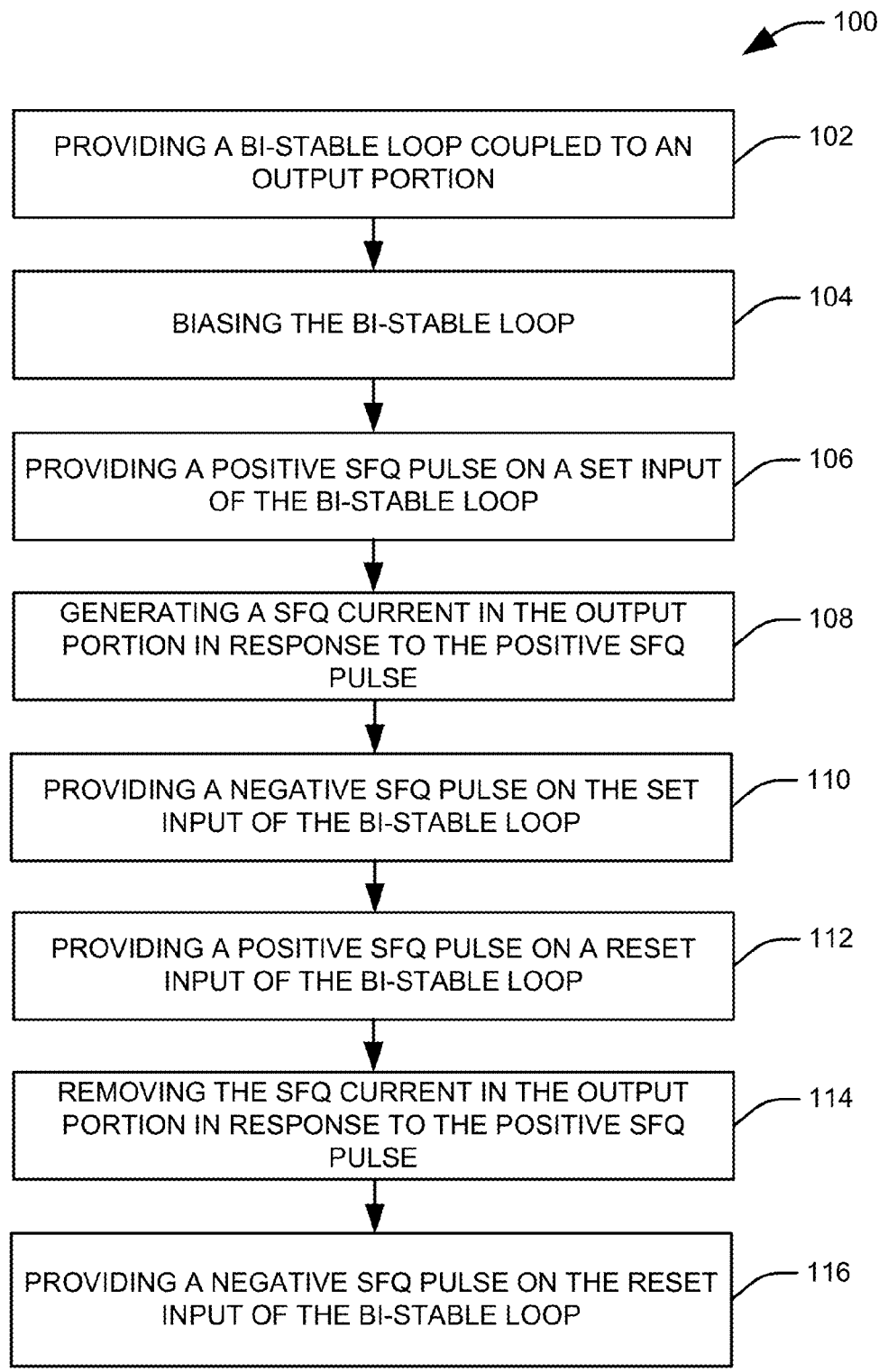
FIG. 12 illustrates a method for controlling a state of a superconducting latch system in accordance with an aspect of the present invention.

FIG. 12 illustrates a method 100 for controlling a state of a superconducting RQL latch system in accordance with an aspect of the present invention. At 102, a bi-stable loop coupled to an output portion is provided. At 104, the bi-stable loop is biased, for example, by DC biasing a set portion and reset portion of the bi-stable loop via inductive coupling to a transformer. At 106, a positive SFQ pulse is provided on a set input of the bi-stable loop. The bi-stable loop generates a SFQ current at 108, which is propagated into the output portion from the bi-stable loop and representative of a set state of the latch system. At 110, a negative SFQ pulse is provided on the set input of the bi-stable loop. At 112, a positive SFQ pulse is provided on a reset input of the bi-stable loop. The bi-stable loop removes the SFQ current from the output portion at 114, which representative of a reset state of the latch system. At 116, a negative SFQ pulse is provided on the reset input of the bi-stable loop.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A superconducting latch system comprising:
   an output portion that retains a state of the latch system; and
   a bi-stable loop that comprises a set superconducting loop coupled between a set input and the output portion, and a reset superconducting loop coupled to a reset input and coupled to the output portion, wherein a positive single flux quantum (SFQ) pulse on the set input when the latch system is in a reset state results in providing a SFQ current in the output portion representative of the latch system being in a set state.

2. The system of claim 1, wherein a negative SFQ pulse on the set input causes a polarity reversal of a set portion and reset portion of the bi-stable loop without affecting the SFQ current in the output portion representative of the latch system being in a set state.

3. The system of claim 2, wherein a subsequent positive SFQ pulse and/or negative SFQ pulse on the set input does not affect the SFQ current in the output portion representative of the latch system being in a set state.

4. The system of claim 1, wherein a positive SFQ pulse on the reset input when the latch system is in a set state results in removing the SFQ current from the output portion representative of the latch system being in a reset state.

5. The system of claim 4, wherein a negative SFQ pulse on the reset input causes a polarity reversal of a set portion and reset portion of the bi-stable loop without affecting the lack of SFQ current in the output portion representative of the latch system being in a reset state.

6. The system of claim 5, wherein a subsequent positive SFQ pulse and/or negative SFQ pulse on the reset input does not affect the lack of SFQ current in the output portion representative of the latch system being in a reset state.

7. The system of claim 1, wherein the set superconducting loop and the reset superconducting loop are both inductively coupled and DC biased to produce a first bi-stable current in the set superconducting loop and a second bi-stable current in the reset superconducting loop, the second bi-stable current being of opposite polarity of the first bi-stable current.

8. The system of claim 7, wherein the set superconducting loop comprises a first set Josephson junction coupled to a second set Josephson junction through a set coupled inductor, the first Josephson junction being coupled to the set input through a set input inductor and the second Josephson junction being coupled to the output portion and the reset superconducting loop comprises a reset Josephson junction coupled to the reset input by a reset input inductor and a reset coupled inductor, the set coupled inductor and the reset coupled inductor providing the inductive coupling between the set superconducting loop and the reset superconducting loop.

9. The system of claim 1, wherein a readout device is coupled to the output portion to provide a non-destructive readout of the state of the latch system.

10. The system of claim 1, further comprising a pulse generator coupled to the set input and/or reset input configured to provide a positive SFQ pulse followed by a negative SFQ pulse, the pulse generator further comprising a plurality of inductor-Josephson junction superconducting loops biased by a bias current provided by a superconducting transformer that receives an AC waveform, which further provides a clocking function for the positive and negative SFQ pulses.

11. A reciprocal quantum logic (RQL) latch system comprising:
an output portion that retains a state of the latch system;
a bi-stable loop that comprises a set superconducting loop coupled between a set input and the output portion and a reset superconducting loop coupled to a reset input and inductively coupled to the set superconducting loop; and
a DC bias that produces a first bi-stable current in the set superconducting loop and a second bi-stable current in the reset superconducting loop, wherein a positive single flux quantum (SFQ) pulse on the set input when the latch system is in a reset state results in providing a SFQ current that propagates through the set superconducting loop to reside in the output portion, the SFQ current in the output portion being representative of the latch system being in a set state.

12. The system of claim 11, wherein a negative SFQ pulse on the set input changes the polarity of both the first bi-stable current in the set superconducting loop and the second bi-stable current in the reset superconducting loop without affecting the SFQ current in the output portion representative of the latch system being in a set state.

13. The system of claim 12, wherein a subsequent positive SFQ pulse and/or negative SFQ pulse on the set input does not affect the SFQ current in the output portion representative of the latch system being in a set state.

14. The system of claim 11, wherein a positive SFQ pulse on the reset input when the latch system is in a set state results in removing the SFQ current from the output portion representative of the latch system being in a reset state.

15. The system of claim 14, wherein a negative SFQ pulse on the reset input changes the polarity of both the first bi-stable current in the set superconducting loop and the second bi-stable current in the reset superconducting loop without affecting the lack of SFQ current in the output portion.

16. The system of claim 15, wherein a subsequent positive SFQ pulse and/or negative SFQ pulse on the reset input does not affect the lack of SFQ current in the output portion representative of the latch system being in a reset state.

17. The system of claim 11, wherein the set superconducting loop comprises a first set Josephson junction coupled to a second set Josephson junction through a set coupled inductor, the first Josephson junction being coupled to the set input through a set input inductor and the second Josephson junction being coupled to the output portion and the reset superconducting loop comprises a reset Josephson junction coupled to the reset input by a reset input inductor and a reset coupled inductor, the set coupled inductor and the reset coupled inductor providing the inductive coupling between the set superconducting loop and the reset superconducting loop.

18. A method for controlling a state of superconducting latch system, the method comprising:
providing a bi-stable loop that includes a set input coupled to a set portion, a reset input coupled to a reset portion, the reset portion being inductively coupled to the set portion and the set portion being coupled to an output portion;
biasing the bi-stable loop to produce a first bi-stable current in the set portion and a second bi-stable current in the reset portion;
providing a positive single flux quantum (SFQ) pulse on the set input; and
generating a SFQ current in response to the positive SFQ pulse in the output portion representative of the latch system being in a set state.

19. The method of claim 18, further comprising:
providing a negative SFQ pulse on the set input; and
reversing the polarity of the first bi-stable current in response to the negative SFQ pulse; and
reversing the polarity of the second bi-stable current in response to reversing the polarity of the first bi-stable current.

20. The method of claim 19, further comprising:
providing a positive SFQ pulse on the reset input;
removing the SFQ current in response to the positive SFQ pulse in the output portion representative of the latch system being in a reset state;
providing a negative SFQ pulse on the reset input;
reversing the polarity of the second bi-stable current in response to the negative SFQ pulse; and
reversing the polarity of the first bi-stable current in response to reversing the polarity of the second bi-stable current.

* * * * *